United States Patent
Saido

(10) Patent No.: US 10,617,002 B2
(45) Date of Patent: Apr. 7, 2020

(54) CIRCUIT BOARD AND MANUFACTURING METHOD THEREOF

(71) Applicant: FANUC CORPORATION, Yamanashi (JP)

(72) Inventor: Norihiro Saido, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/272,620

(22) Filed: Feb. 11, 2019

(65) Prior Publication Data

US 2019/0274215 A1    Sep. 5, 2019

(30) Foreign Application Priority Data

Mar. 2, 2018  (JP) .................................. 2018-037907

(51) Int. Cl.
| | |
|---|---|
| H05K 1/09 | (2006.01) |
| H05K 3/26 | (2006.01) |
| H05K 1/11 | (2006.01) |
| H05K 3/00 | (2006.01) |

(52) U.S. Cl.
CPC ............... *H05K 1/111* (2013.01); *H05K 1/09* (2013.01); *H05K 3/0097* (2013.01); *H05K 3/26* (2013.01); *H05K 2201/0776* (2013.01)

(58) Field of Classification Search
CPC combination set(s) only.
See application file for complete search history.

(56) References Cited

U.S. PATENT DOCUMENTS

2014/0131068 A1*  5/2014  Kim ..................... H05K 3/4644
                                                    174/251
2018/0062054 A1*  3/2018  Baldo .................... H05K 3/184

FOREIGN PATENT DOCUMENTS

| JP | H09-172281 A | 6/1997 |
| JP | 2001-358429 A | 12/2001 |
| JP | 2006-019405 A | 1/2006 |
| JP | 3952660 B2 | 8/2007 |
| JP | 2016-072386 A | 5/2016 |

OTHER PUBLICATIONS

An Office Action mailed by the Japanese Patent Office dated Nov. 5, 2019, which corresponds to Japanese Patent Application No. 2018-037907 and is related to U.S. Appl. No. 16/272,620.

* cited by examiner

*Primary Examiner* — Jeremy C Norris
(74) *Attorney, Agent, or Firm* — Studebaker & Brackett PC

(57) ABSTRACT

A circuit board is obtained by providing a wiring pattern on an insulating board. The circuit board includes a first region and a second region. In the first region, a first wiring pattern is provided on which a first surface treatment is applied. In the second region, a second wiring pattern is provided on which a second surface treatment having a cutting fluid resistance and/or a humidity resistance lower than the first surface treatment is applied.

4 Claims, 5 Drawing Sheets

CIRCUIT BOARD AND MANUFACTURING METHOD THEREOF

This application is based on and claims the benefit of priority from Japanese Patent Application No. 2018-037907, filed on Mar. 2, 2018, the content of which is incorporated herein by reference.

BACKGROUND OF THE INVENTION

Field of the Invention

The present invention relates to a circuit board and a method of manufacturing it.

Related Art

Conventionally, under an environment in which a machine tool is used, a cutting fluid is converted into mist so as to be adhered to a circuit board within an electrical/electronic device. Hence, a wiring pattern is corroded (electrolytically corroded) so as to be broken, and thus a failure occurs in the device. The cause of electrolytic corrosion of a wiring pattern is not limited to a cutting fluid, and the electrolytic corrosion may be caused by humidity (water). In order to prevent the failure caused by the electrolytic corrosion or the corrosion of the wiring pattern as described above, various methods of detecting degradation of a circuit board are proposed.

As one method, there is a technology in which a degradation detection pattern having a structure that is degraded more easily than a normal wiring pattern is provided in a circuit board. For example, patent document 1 discloses a circuit board where a pattern whose width is narrower than the other wiring patterns is provided and a circuit board where a pattern whose insulation distance is shorter than them is provided.

Patent Document 1: Japanese Patent No. 3952660

SUMMARY OF THE INVENTION

However, the pattern whose width is narrower than the other wiring patterns or the pattern whose insulation distance is shorter than them is present, and thus the yield in the manufacturing process of the circuit board is decreased.

The present invention is made in view of the foregoing problem, and an object of the present invention is to provide a circuit board which can reduce a decrease in yield and which can detect degradation and a method of manufacturing such a circuit board.

(1) The present invention relates to a circuit board (for example, a circuit board 10, 20 which will be described later) in which a wiring pattern is provided on an insulating board, and in which the wiring pattern includes: a first wiring pattern on which a first surface treatment is applied; and a second wiring pattern on which a second surface treatment having a cutting fluid resistance and/or a humidity resistance lower than the first surface treatment is applied.

(2) Preferably, the circuit board (for example, a circuit board 20 which will be described later) of (1) includes: a first circuit board (for example, a first circuit board 21 which will be described later) on which the first wiring pattern is provided; and a second circuit board (for example, a second circuit board 22 which will be described later) on which the second wiring pattern is provided, which is separate from the first circuit board and which is connected to the first circuit board.

(3) The present invention relates to a method of manufacturing a circuit board (for example, a circuit board 20 which will be described later) which includes: a step of forming, on a first insulating board, a first wiring pattern on which a first surface treatment is applied so as to produce a first circuit board; a step of forming, on a second insulating board, a second wiring pattern on which a second surface treatment having a cutting fluid resistance and/or a humidity resistance lower than the first surface treatment is applied so as to produce a second circuit board; and a step of connecting the second circuit board to the first circuit board.

(4) The present invention relates to a method of manufacturing a circuit board (for example, a circuit board 10 which will be described later) which includes: a step of forming a wiring pattern in a first region (for example, a first region 11 which will be described later) and a second region (for example, a second region 12 which will be described later) in an insulating board; a step of performing first masking so as to cover the second region and then performing first surface treatment on the first region; and a step of releasing the first masking, performing second masking so as to cover the first region and then performing, on the second region, a second surface treatment having a cutting fluid resistance and/or a humidity resistance lower than the first surface treatment.

According to the present invention, an object is to provide a circuit board which can reduce a decrease in yield and which can detect degradation and a method of manufacturing such a circuit board.

DETAILED DESCRIPTION OF THE INVENTION

Figure 1:
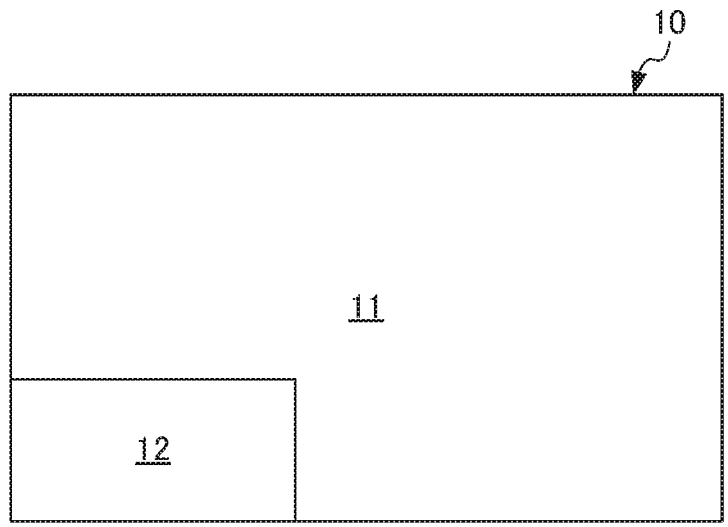
FIG. 1 is a plan view of a circuit board according to a first embodiment of the present invention.

Circuit boards according to embodiments of the present invention will be described below with reference to drawings. In a second embodiment, the same configurations as in a first embodiment are identified with the same reference numerals, corresponding configurations are identified with reference numerals according to the same regularity and the description thereof will be omitted as necessary. In the second embodiment, the description of the same actions and effects as in the first embodiment will be omitted as necessary.

First Embodiment

A circuit board 10 according to the first embodiment will first be described with reference to FIG. 1. FIG. 1 is a plan view of the circuit board 10.

As shown in FIG. 1, the circuit board 10 is obtained by providing a wiring pattern on an insulating board, and is applied to a machine tool, a robot controller and the like. The circuit board 10 includes a first region 11 and a second region 12.

In the first region 11, a first wiring pattern is provided on which a first surface treatment is applied. Examples of the first surface treatment include solder coat and Au flash.

In the second region 12, a second wiring pattern is provided on which a second surface treatment having a cutting fluid resistance lower than the first surface treatment is applied. The second region 12 includes a corner portion of the circuit board 10. Examples of the second surface treatment include pre-flux, Sn plating and Ag plating. Examples of the cutting fluid include a liquid containing chlorine, a liquid containing sulfur and water.

Figure 2:
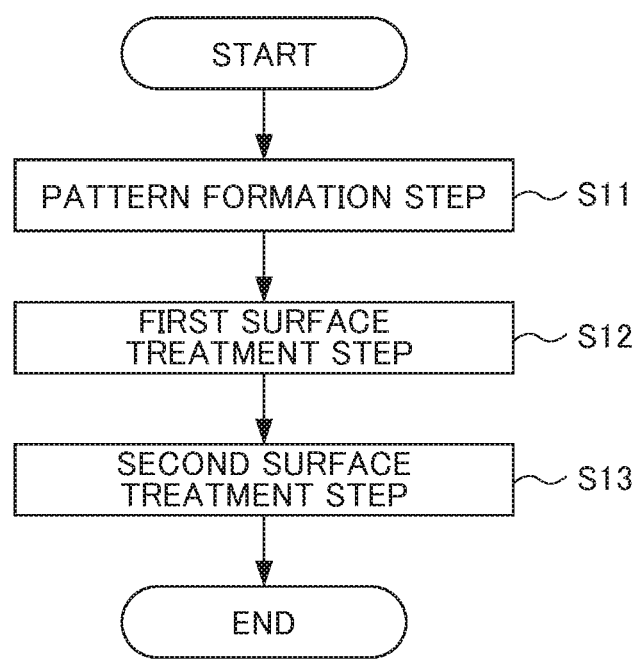
FIG. 2 is a flowchart illustrating a method of manufacturing the circuit board shown in FIG. 1.

A method of manufacturing the circuit board 10 will then be described with reference to FIG. 2. FIG. 2 is a flowchart illustrating the method of manufacturing the circuit board 10 shown in FIG. 1.

As shown in FIG. 2, the method of manufacturing the circuit board 10 (see FIG. 1) includes a pattern formation step S11, a first surface treatment step S12 and a second surface treatment step S13.

The pattern formation step S11 is a step of forming the wiring pattern in the first region 11 (see FIG. 1) and the second region 12 (see FIG. 1) in the insulating board.

The first surface treatment step S12 is a step of performing first masking so as to cover the second region 12 (see FIG. 1) with a masking tape (such as a film) and then performing the first surface treatment on the first region 11 (see FIG. 1).

The second surface treatment step S13 is a step of removing the masking tape in the second region 12 (see FIG. 1) so as to release the first masking, performing second masking so as to cover the first region 11 (see FIG. 1) with a masking tape and then performing the second surface treatment on the second region 12 (see FIG. 1).

After the steps S11 to S13 described above are performed, the masking tape in the first region 11 (see FIG. 1) is removed, with the result that the circuit board 10 is completed.

For example, effects below are achieved by the circuit board 10 of the present embodiment. The circuit board 10 of the present embodiment is the circuit board 10 in which the wiring pattern is provided on the insulating board, and the wiring pattern includes: the first wiring pattern (the first region 11) on which the first surface treatment is applied; and the second wiring pattern (the second region 12) on which the second surface treatment having a cutting fluid resistance lower than the first surface treatment is applied. The method of manufacturing the circuit board 10 according to the present embodiment includes: the pattern formation step S11 of forming the wiring pattern in the first region 11 and the second region 12 in the insulating board; the first surface treatment step S12 of performing the first masking so as to cover the second region 12 and then performing the first surface treatment on the first region 11; and the second surface treatment step S13 of releasing the first masking, performing the second masking so as to cover the first region 11 and then performing the second surface treatment having a cutting fluid resistance lower than the first surface treatment on the second region 12.

Hence, the second wiring pattern in the second region is used as a degradation detection pattern, and thus it is possible to detect degradation without provision of a pattern whose width is narrower than the other wiring patterns or a pattern whose insulation distance is shorter than them. Hence, as compared with a case where the pattern whose width is narrower than the other wiring patterns is provided and a case where the pattern whose insulation distance is shorter than them, the structure of the wiring is simple, and thus it is possible to reduce a decrease in yield.

Second Embodiment

Figure 3:
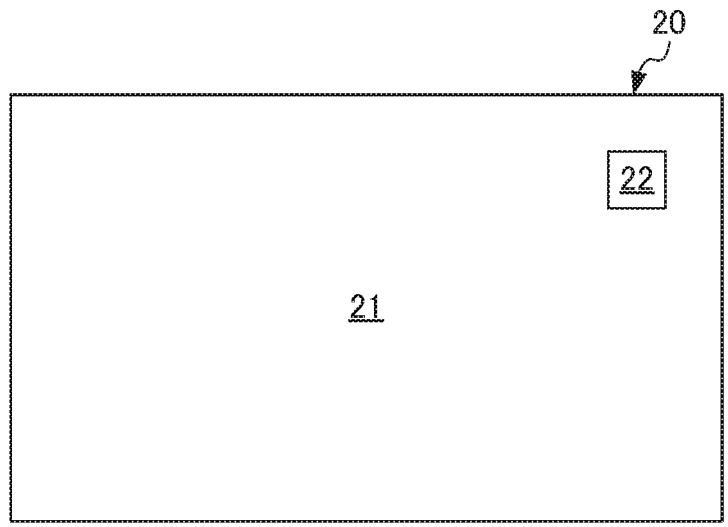
FIG. 3 is a plan view of a circuit board according to a second embodiment of the present invention.
Figure 4:
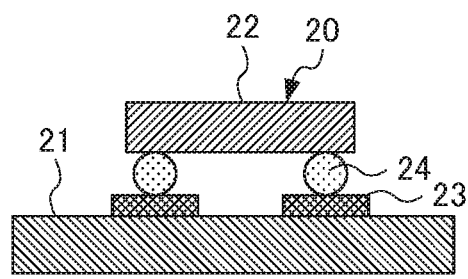
FIG. 4 is a side cross-sectional view of the circuit board shown in FIG. 3.

A circuit board 20 according to the second embodiment will then be described with reference to FIGS. 3 and 4. FIG. 3 is a plan view of the circuit board 20. FIG. 4 is a side cross-sectional view of the circuit board 20 shown in FIG. 3.

As shown in FIGS. 3 and 4, the circuit board 20 includes a first circuit board 21, a second circuit board 22, a pad 23 and a solder joint portion 24.

The first circuit board 21 is obtained by providing, on a first insulating board, a first wiring pattern on which a first surface treatment is applied. The first surface treatment in the second embodiment is the same as that in the first embodiment. On the first circuit board 21, the first surface treatment is totally applied. The outside shape of the first circuit board 21 agrees with the outside shape of the circuit board 20 in plan view.

The second circuit board 22 is obtained by providing, on a second insulating board, a second wiring pattern on which a second surface treatment is applied. The second insulating board is a board which is separate from the first insulating board, and is connected to the first insulating board with the pad 23 and the solder joint portion 24. The second surface treatment in the second embodiment is the same as that in the first embodiment. On the second circuit board 22, the second surface treatment is totally applied. The second circuit board 22 is located inward of a corner portion of the circuit board 20 in plan view.

On the second circuit board 22, the second wiring pattern which serves as a degradation detection pattern is preferably arranged in a position to which oil mist derived from a cutting fluid is easily adhered.

Figure 5:
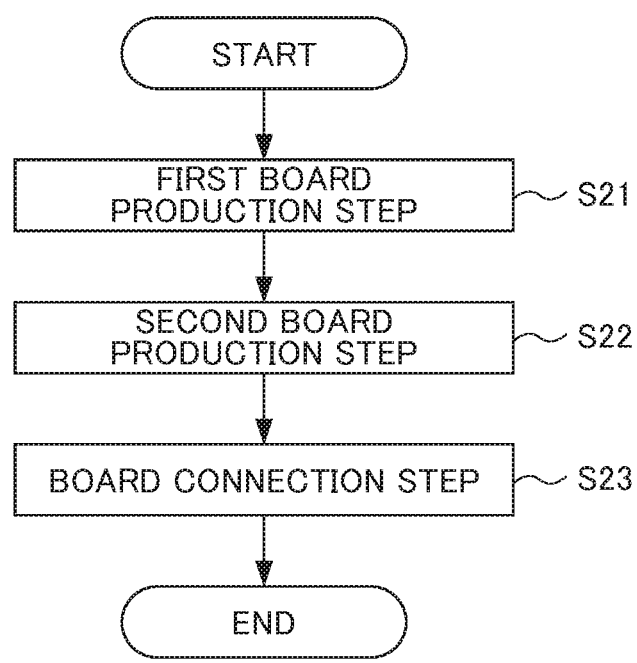
FIG. 5 is a flowchart illustrating a method of manufacturing the circuit board shown in FIGS. 3 and 4.

A method of manufacturing the circuit board 20 will then be described with reference to FIG. 5. FIG. 5 is a flowchart illustrating the method of manufacturing the circuit board 20 shown in FIGS. 3 and 4.

As shown in FIG. 5, the method of manufacturing the circuit board 20 (see FIGS. 3 and 4) includes a first board production step S21, a second board production step S22 and a board connection step S23.

The first board production step S21 is a step of forming, on the first insulating board, the first wiring pattern on which the first surface treatment is applied so as to produce the first circuit board 21.

The second board production step S22 a step of forming, on the second insulating board, the second wiring pattern on which the second surface treatment is applied so as to produce the second circuit board 22.

The board connection step S23 is a step of connecting the second circuit board 22 to the first circuit board 21 with the pad 23 and the solder joint portion 24. The steps S21 to S23 described above are applied so as to complete the circuit board 20.

For example, effects below are achieved by the circuit board 20 of the present embodiment. The circuit board 20 of the present embodiment includes, as the insulating boards, the first circuit board 21 on which the first wiring pattern is provided and the second circuit board 22 on which the second wiring pattern is provided, which is separate from the first circuit board 21 and which is connected to the first circuit board 21. The method of manufacturing the circuit board 20 according to the present embodiment includes: the first board production step S21 of forming, on the first insulating board, the first wiring pattern on which the first surface treatment is applied so as to produce the first circuit board 21; the second board production step S22 of forming, on the second insulating board, the second wiring pattern on which the second surface treatment having a cutting fluid resistance lower than the first surface treatment is applied so as to produce the second circuit board 22; and the board connection step S23 of connecting the second circuit board 22 to the first circuit board 21.

Hence, the second wiring pattern of the second circuit board 22 is used as the degradation detection pattern, and thus it is possible to detect degradation without provision of a pattern whose width is narrower than the other wiring patterns or a pattern whose insulation distance is shorter than them. Hence, as compared with a case where the pattern whose width is narrower than the other wiring patterns is provided and a case where the pattern whose insulation distance is shorter than them, the structure of the wiring is simple, and thus it is possible to reduce a decrease in yield.

The present invention is not limited to the embodiments described above, and various modifications and variations are possible. Although in the embodiments described above, the second surface treatment is the surface treatment which has a cutting fluid resistance lower than the first surface treatment, there is no limitation to this configuration. The second surface treatment may be surface treatment which has a humidity resistance lower than the first surface treatment. In this case, degradation caused by humidity (water) can easily be detected. On the second circuit board 22, the second wiring pattern which serves as the degradation detection pattern is preferably arranged in a position to which humidity (water) is easily adhered.

The second surface treatment may be surface treatment which has a cutting fluid resistance and a humidity resistance lower than the first surface treatment. In this case, degradation caused by the cutting fluid resistance and humidity (water) can easily be detected.

EXPLANATION OF REFERENCE NUMERALS

10, 20 circuit board
11 first region
12 second region
21 first circuit board
22 second circuit board
23 pad
24 solder joint portion

What is claimed is:

1. A circuit board in which a wiring pattern is provided on an insulating board,
   wherein the wiring pattern includes: a first wiring pattern on which a first surface treatment is applied; and a second wiring pattern on which a second surface treatment with a layer having a cutting fluid resistance and/or a humidity resistance lower than a layer of the first surface treatment is applied.

2. The circuit board according to claim 1, wherein the insulating board includes:
   a first circuit board on which the first wiring pattern is provided; and
   a second circuit board on which the second wiring pattern is provided, which is separate from the first circuit board and which is connected to the first circuit board.

3. A method of manufacturing a circuit board comprising:
   a step of forming, on a first insulating board, a first wiring pattern on which a first surface treatment is applied so as to produce a first circuit board;
   a step of forming, on a second insulating board, a second wiring pattern on which a second surface treatment with a layer having a cutting fluid resistance and/or a humidity resistance lower than a layer of the first surface treatment is applied so as to produce a second circuit board; and
   a step of connecting the second circuit board to the first circuit board.

4. A method of manufacturing a circuit board comprising:
   a step of forming a wiring pattern in a first region and a second region in an insulating board;
   a step of performing first masking so as to cover the second region and then performing first surface treatment on the first region; and
   a step of releasing the first masking, performing second masking so as to cover the first region and then performing, on the second region, a second surface treatment with a layer having a cutting fluid resistance and/or a humidity resistance lower than a layer of the first surface treatment.

* * * * *